United States Patent
Yuda

(10) Patent No.: US 8,085,597 B2
(45) Date of Patent: Dec. 27, 2011

(54) NONVOLATILE SEMICONDUCTOR MEMORY AND DATA WRITING METHOD FOR NONVOLATILE SEMICONDUCTOR MEMORY

(75) Inventor: Takashi Yuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 352 days.

(21) Appl. No.: 12/503,091

(22) Filed: Jul. 15, 2009

(65) Prior Publication Data

US 2010/0020603 A1    Jan. 28, 2010

(30) Foreign Application Priority Data

Jul. 22, 2008  (JP) ................................. 2008-188791

(51) Int. Cl.
*G11C 16/04*    (2006.01)

(52) U.S. Cl. .................................. 365/185.21; 365/185.3

(58) Field of Classification Search ............. 365/185.21, 365/185.3, 185.22
See application file for complete search history.

(56) References Cited

U.S. PATENT DOCUMENTS 6,522,585 B2 *   2/2003   Pasternak ................. 365/185.21
6,930,924 B2 *   8/2005   Takase et al. ............. 365/185.28

FOREIGN PATENT DOCUMENTS

JP            2008-085196            4/2008

* cited by examiner

*Primary Examiner* — Vu Le
(74) *Attorney, Agent, or Firm* — Volentine & Whitt, PLLC

(57) ABSTRACT

A method having the steps of applying the same gate voltage to each of gate terminals of a plurality of memory cells via word lines to designate the memory cells as a write target, and simultaneously applying a write voltage that corresponds to each write data across drain-source terminals of two or more memory cells that are write targets via bit lines to write simultaneously a plurality of data elements having mutually different data values to the memory cells.

12 Claims, 11 Drawing Sheets

NONVOLATILE SEMICONDUCTOR MEMORY AND DATA WRITING METHOD FOR NONVOLATILE SEMICONDUCTOR MEMORY

BACKGROUND OF THE INVENTION

1. Field of the Invention

The present invention relates to nonvolatile semiconductor memory and to a data writing method for nonvolatile semiconductor memory.

2. Description of the Related Art

Nonvolatile semiconductor memory is known that has two charge accumulation sections in a single memory cell, and two bits of storage capacity for each memory cell by storing two values ("0" and "1") in the charge accumulation sections. Such a memory cell has an nMOSFET structure, for example, and has two charge accumulation sections that are formed at a distance from each other at the drain side and the source side. A state in which a charge is accumulated in the charge accumulation sections corresponds to "0" data, for example, and a state in which a charge is not accumulated corresponds to "1" data, for example, whereby two bits of data can be stored per memory cell, one bit in each charge accumulation section. The data of this memory cell are written, read, and erased by the method described below, for example.

For example, in the case of writing the data "0" to the charge accumulation section on the drain side, a positive voltage is applied to the drain terminal and the gate terminal, and the ground voltage is applied to the source terminal. Hot electrons are thereby injected to the charge accumulation section on the drain side and retained, and the data "0" is written.

When the data stored in the charge accumulation section on the drain side is read, a positive voltage is applied to the source terminal and the gate terminal, and the ground voltage is applied to the drain terminal. When a charge is not accumulated in the charge accumulation section on the drain side at this time, i.e., when the data "1" is stored in the drain-side charge accumulation region, a comparatively large read current is obtained. On the other hand, when a charge is accumulated in the charge accumulation section on the drain side, i.e., when the data "0" is stored in the drain-side charge accumulation section, the effects of the accumulated charge make the read current lower than when the data "1" is stored. Since the amount of the read current thus differs according to the presence of a charge in the charge accumulation section, data can be read by determining the amount of the read current.

In the case of erasing the data stored in the charge accumulation section on the drain side, a positive voltage is applied to the drain terminal, a zero voltage or negative voltage is applied to the gate terminal, and the source terminal is placed in an open state. Hot holes that occur in the vicinity of the drain region are thereby injected to the charge accumulation section, and the charge accumulated in the charge accumulation section is neutralized, whereby the data is erased.

FIG. 1 is a graph showing an ideal distribution of the read current in the memory cell having two bits of storage capacity (hereinafter referred to as 2-bit memory cell), wherein the horizontal axis indicates the read current value, and the vertical axis indicates the frequency. As shown by the graph, the read current is distributed at a certain width about a corresponding reference value for each data element "0" and "1". The range between the read current distributions that correspond to the mutually different data ("0" and "1") is referred to as the current window. An adequately wide current window must be ensured in order to accurately read the data written in the memory cell. In other words, the data becomes difficult to accurately read when the read current value for the data "0" and the read current value for the data "1" are close to each other.

Nonvolatile semiconductor memory has recently been developed that has two charge accumulation sections in one memory cell, and four bits of storage capacity per memory cell by storing four values of data ("00", "01", "10", "11") in the charge accumulation sections. Four-value (i.e., 2-bit) data storage in the charge accumulation sections is accomplished by also controlling the amount of charge accumulated in the charge accumulation sections and associating the amounts of accumulated charge to each of the four values of data. The data are read according to the same principle as the 2-bit memory cell described above, and the four values of data are determined by reading the value of the read current.

In the case of a 4-bit memory cell, the current window is narrower than in the case of the 2-bit memory cell shown in FIG. 1. In other words, in comparison to the 2-bit memory cell in which only the presence of a charge is determined, higher read precision is required in a 4-bit memory cell, which the amount of the accumulated charge must also be determined.

Furthermore, a semiconductor memory cell having two charge accumulation sections in a single memory cell has problems in that the read current of the data written in one of the charge accumulation sections is reduced by writing to the other charge accumulation section of the same memory cell. Specifically, the value of the read current that corresponds to the data "1" is reduced by a subsequent writing of the data "0" to the other charge accumulation section. The reason for this is considered to be that the flow of the read current for the data "1" stored in one charge accumulation is impeded by the charge that is accumulated in order for the data "0" to be stored in the other charge accumulation section. After writing of data to one charge accumulation section is completed, data is written to the other (mirror side) charge accumulation section in the same memory cell, whereby the read current that would have been obtained in accordance with the data written to the one charge accumulation section decreases subsequently. The current window then decreases in width, which leads to reduced accuracy of data reading.

In a 2-bit memory cell, a measure referred to as verify writing is adopted whereby such a reduction in the read current of the mirror side is taken into account, data write processing is performed incrementally over a plurality of cycles so as to minimize the amount of current reduction, and the write processing is ended once the read current has reached a predetermined target value that is in accordance with the stored data. Specifically, verify writing is a data writing method for injecting current in incremental steps so as to obtain the desired read current by alternately injecting current to the charge accumulation section and verifying the read current repeatedly. Through this verify writing, fluctuation of the read current can be suppressed for a plurality of memory cells, and reductions in the read current of the mirror side by excessive charge accumulation can be kept to a minimum in comparison to a case in which the entire charge is injected at once.

However, since the current window of a 4-bit memory cell is narrower than the current window of a 2-bit memory cell, as described above, the abovementioned problem of reduced read current on the mirror side cannot be overcome merely by verify writing.

Japanese Laid-open Patent Publication No. 2008-85196 proposes the data writing method described below for overcoming the abovementioned problem of current reduction on the mirror side in a nonvolatile semiconductor memory in which a plurality of 4-bit memory cells is arranged in an array and capable of storing two bits of data in each of two charge accumulation sections formed on the source side and the drain side.

The four bits of data to be stored in each memory cell are divided into two higher bits and two lower bits. Of the 2-bit data divided for the plurality of memory cells, the data "00", for which the read current is the lowest (i.e., the charge accumulation amount is the greatest) are all stored first. Specifically, the data "00" are written first among the data divided in the charge accumulation sections of the source side and drain side of each memory cell. After storage of the data "00" is completed for the charge accumulation sections, the other data "01" and "10" are written. Since a state in which a charge is not retained in a charge accumulation section corresponds to the data "11," there is no need for specific write processing when the data "11" is stored. Writing of each data element is differentiated by varying a gate voltage Vgw in accordance with the stored data, the gate voltage Vgw being fed via a word line, and the drain-source voltage Vdsw is constant regardless of the value of the stored data. During writing of the data, charge injection and write current verification are performed in alternating fashion, and writing is completed once the write current has reached a predetermined value. When the data "01" and "10" are written, the number of writes is coordinated.

By this type of data writing method, since the data "00" having the lowest read current is written first, it is possible to prevent the read currents of the data "01" and "10" subsequently written to the other charge accumulation section of the same memory cell from subsequently fluctuating. Although the read current of the data "00" is reduced by the data "01" and "10" subsequently written to the other charge accumulation section of the same memory cell, since the data "00" has the lowest read current of the four values of data, the current window is not narrowed, and no problems therefore occur. For the data "01" and "10," since charges are injected incrementally over a plurality of cycles while the read current is verified, fluctuation of the read current between cells can be minimized, and the current window can be ensured.

SUMMARY OF THE INVENTION

However, data cannot be efficiently written in a method in which the writing of data is differentiated by varying the applied gate voltage Vgw according to the stored data, as described in Japanese Laid-open Patent Publication No. 2008-85196. FIGS. 2A through 2C are views showing the steps whereby data is written by this method to two memory cells 10a and 10b that are connected to a shared or common bit line, and FIGS. 2A through 2C show a portion of the structure of a memory cell array that constitutes a nonvolatile semiconductor memory. In this case, the data "00" is written to the source-side charge accumulation sections 30a and 30b of the memory cells 10a and 10b, respectively, the data "01" is written to the drain-side charge accumulation section 32a of the memory cell 10a, and the data "10" is written to the drain-side charge accumulation section 32b of the memory cell 10b.

Since the data "00" is written before the other data as described above, the charge accumulation sections written to are the source-side charge accumulation sections 30a and 30b of the memory cells 10a and 10b, respectively. At this time, a predetermined drain-source voltage Vdsw is applied across the drain and source of the memory cells 10a and 10b via bit lines BL, and a gate voltage Vgw1 corresponding to the data "00" is applied to the gate terminals of the memory cells 10a and 10b via the word line WL. A certain charge is thereby accumulated in the charge accumulation sections 30a and 30b. Write processing is completed by injecting charges over a plurality of cycles while verifying the read current (FIG. 2A).

After write processing of the data "00" is completed, the remaining data "01" and "10" are written to the drain-side charge accumulation sections 32a and 32b of the memory cells 10a and 10b, respectively, but in the write method described in Japanese Laid-open Patent Publication No. 2008-85196, since the writing of data is differentiated by causing the gate voltage Vgw applied to the memory cells via the word line WL to correspond to the stored data, different gate voltages Vgw2 and Vgw3 must be applied to store the data "01", and the data "10," respectively, and a plurality of data elements having mutually different values cannot be written at the same time to memory cells that are connected to the same word line WL. Consequently, three stages of processing are necessary, in which write processing of the data "00" is completed, then the data "01" is written (FIG. 2B), and then the data "10" is written (FIG. 2C). In other words, in a method in which the amount of the written charge is adjusted by the gate voltage, data having mutually different values cannot be written at the same time to a plurality of memory cells connected to a shared or common word line, and write processing takes a long time to complete.

The present invention was developed in view of the problems described above, and an object of the present invention is to provide a data writing method for a nonvolatile semiconductor memory whereby data writing to one charge accumulation section in a memory cell is prevented from causing the read current of data written to another charge accumulation section in the same memory cell to decrease, the current window is ensured, and the write time can be shortened in a nonvolatile semiconductor memory in which a plurality of memory cells each having a plurality of charge accumulation sections is arranged in an array.

The data writing method for a nonvolatile semiconductor memory of the present invention is a data writing method for injecting a charge to charge accumulation sections of memory cells of a nonvolatile semiconductor memory and writing multi-value data in which a data value corresponds to an amount of injected charge, the nonvolatile semiconductor memory comprising a plurality of word lines; a plurality of memory cells, each of which having a plurality of charge accumulation sections, and having a MOSFET structure in which a gate terminal is connected to each of the word lines; and a plurality of bit lines connected to a drain terminal and a source terminal of each of the memory cells; wherein the same gate voltage is applied to each of the gate terminals of the plurality of memory cells via the word lines, each of the memory cells is designated as a write target, a write voltage that corresponds to each write data is simultaneously applied across drain-source terminals of two or more memory cells that are write targets via the bit lines, and a plurality of data elements having mutually different data values is written to the memory cells at the same time.

The nonvolatile semiconductor memory of the present invention is a nonvolatile semiconductor memory comprising a plurality of word lines; a plurality of memory cells, each of which having a charge accumulation section, and having a MOSFET structure in which a gate terminal is connected to each of the word lines; a plurality of bit lines connected to a drain terminal and a source terminal of each of the memory cells; a row decoder for applying a gate voltage to the gate terminals of the plurality of memory cells via the word lines;

and a column decoder for applying a write voltage between the drain and source of each of the memory cells via the bit lines; wherein a charge is injected to the charge accumulation section, and multi-value data in which each data value corresponds to an injected charge amount is written to each of the memory cells; and in the nonvolatile semiconductor memory, the row decoder applies the same gate voltage to each gate terminal of the memory cells via the word lines, and designates each of the memory cells as a write target; and the column decoder simultaneously applies, via the bit lines, write voltages that correspond to items of write data across drain-source terminals of two or more memory cells that are write targets, and writes a plurality of data elements having mutually different data values to each of the memory cells at the same time.

According to the nonvolatile semiconductor memory of the present invention, in writing multi-value data, the gate voltage applied to the gate terminal of a memory cell is shared between data types, a different write voltage is applied across the drain-source terminals of the memory cell according to the value of the stored data, and data having mutually different values are written to a plurality of memory cells within the selection period of a single word line WL. The write time can therefore be reduced in comparison to that of the conventional writing method.

DETAILED DESCRIPTION OF THE INVENTION

Figure 1:
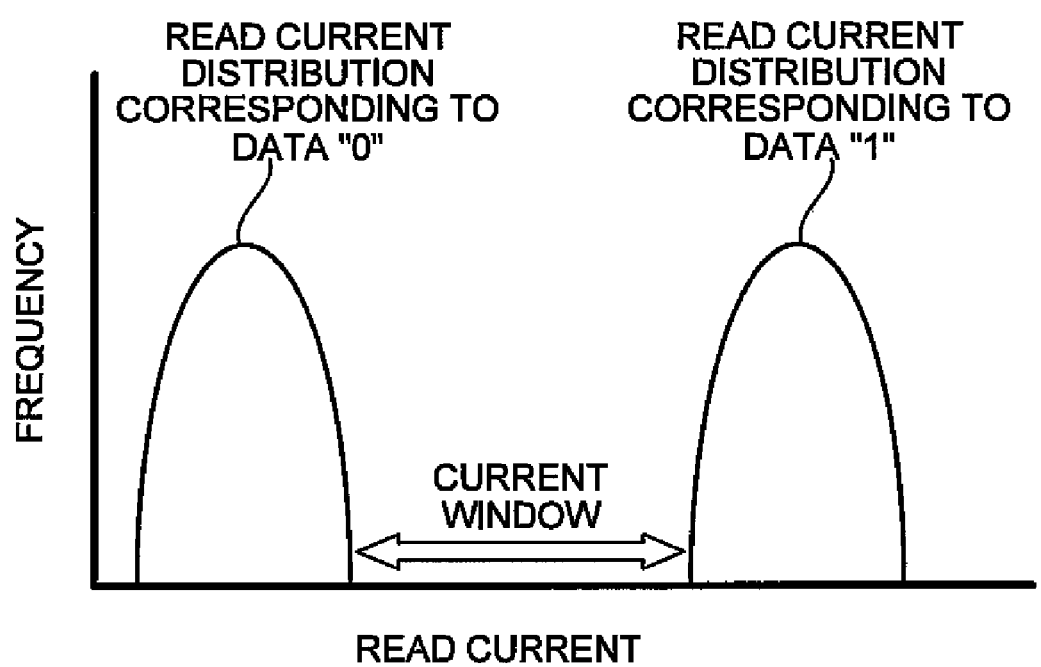
FIG. 1 is a view showing the distributions of the write currents of two values of data stored in a 2-bit memory cell having two charge accumulation sections in a single memory cell.

Embodiments of the present invention will be described hereinafter with reference to the drawings. The same reference symbols are used to refer to constituent elements and parts that are essentially the same or equivalent in the drawings described hereinafter.

First Embodiment

Figure 3:
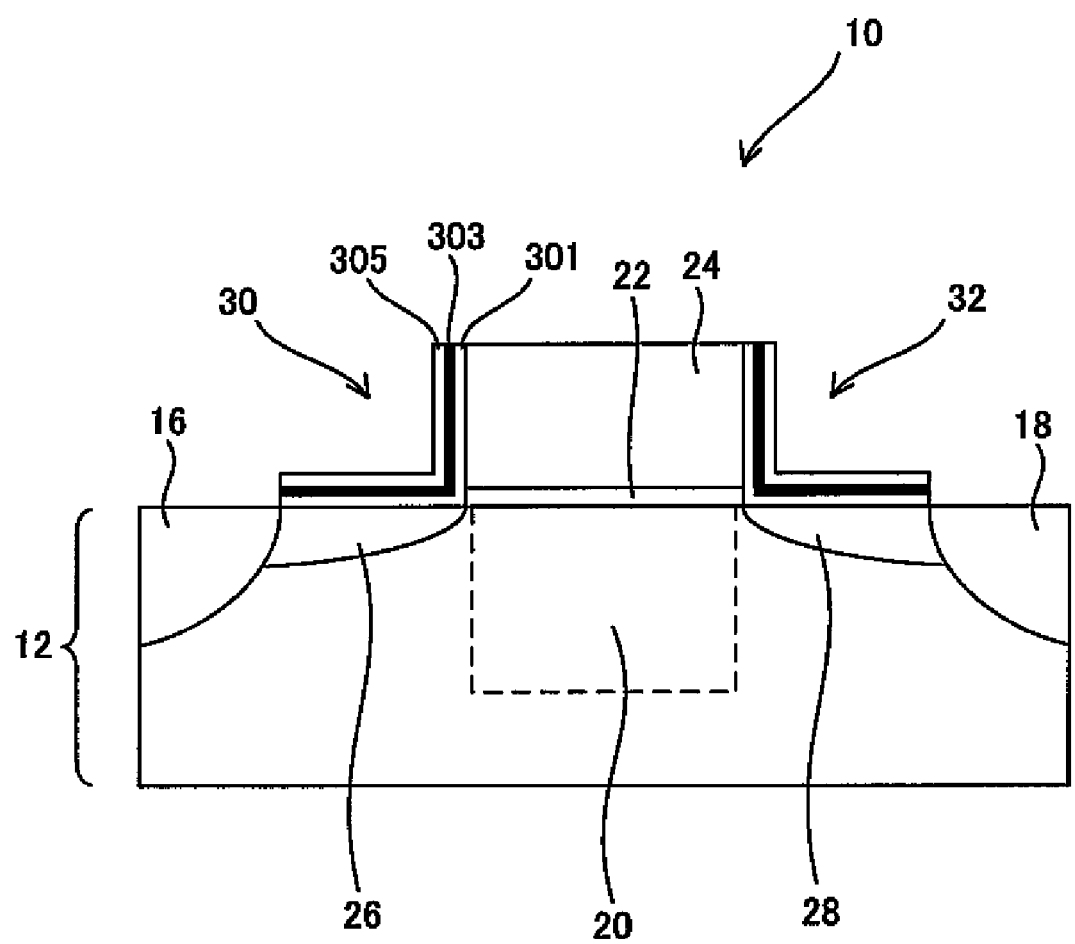
FIG. 3 is a sectional view showing the structure of a memory cell according to an embodiment of the present invention.

FIG. 3 is a sectional view showing the principal parts of a memory cell 10 that constitutes the nonvolatile semiconductor memory of the present invention. In the present embodiment, an example is described in which the memory cell 10 is composed of an nMOSFET.

In the memory cell 10, a gate electrode 24 composed of polysilicon is formed on the upper surface of a p-type silicon substrate 12 via a gate oxide film 22 composed of $SiO_2$. A drain region 18 and a source region 16 containing a high concentration of an n-type impurity are formed on either side of the gate electrode 24 on the surface of the silicon substrate 12. The surface region of the silicon substrate 12 immediately below the gate electrode 24 is a channel region 20 in which a current path is formed during operation of the nMOSFET. Between the channel region 20 and the source region 16 and drain region 18, n-type extension regions 26 and 28 having a relatively low impurity concentration are formed adjacent to the source region 16 and the drain region 18. The extension regions 26 and 28 are provided in order to efficiently inject charges to first and second charge accumulation sections described hereinafter.

A first charge accumulation section 30 is provided at the top of the extension region 26 on the source side, and a second charge accumulation section 32 is provided at the top of the extension region 28 on the drain side. The first and second charge accumulation sections 30, 32 are formed by ONO stacked insulator films composed of a silicon oxide film 301, a silicon nitride film 303, and a silicon oxide film 305. The first and second charge accumulation sections 30, 32 each extend from the extension regions 26 and 28 along the side walls of the gate electrode 24. Charges can thereby be reliably accumulated and retained. Since the first charge accumulation section 30 and the second charge accumulation section 32 are physically unconnected, i.e., formed at a distance from each other, charges can be accumulated and retained separately and independently by each charge accumulation section.

The principles of writing, reading, and erasing data with respect to the memory cell 10 thus structured will next be described. The description given below is of an example of a case of writing, reading, and erasing data with respect to the second charge accumulation section 32 on the drain side.

First, when data is written to the second charge accumulation section 32, a positive voltage (hereinafter referred to as the gate voltage (Vgw)) is applied to the gate electrode 24, a positive voltage (hereinafter referred to as the write voltage (Vdsw)) is applied to the drain region 18, and the source region 16 is at the ground potential. An electric field is thereby concentrated at the extension region 28 of the drain side, and hot electrons are generated by collision ionization within the extension region 28. A portion of the hot electrons overcome an energy barrier that occurs between the extension region 28 and the silicon oxide film 301 that constitutes the second charge accumulation section 32, and are injected to and retained by the silicon nitride film 303. Four values ("00," "01," "10," "11") of data can be written to the second charge accumulation section 32 by causing the amount of charge injected to the second charge accumulation section 32 to correspond to the stored data. For example, the injected charge amount is maximized to store the data "00," the injected charge amount is made relatively large to store the data "01," the injected charge amount is made relatively small to store the data "10," and the injected charge amount is set to zero to store the data "11." The nonvolatile semiconductor memory 100 of the present embodiment is configured so that four values (2 bits) of data are stored in the charge accumulation sections 30, 32 by varying the charge injected to the second charge accumulation section 32 by varying the write voltage (Vdsw) applied across the drain-source of each memory cell in accordance with the stored data.

Then, when the data stored in the second charge accumulation section 32 is read, a positive voltage (referred to as the gate voltage (Vgr)) is applied to the gate electrode 24, a positive voltage (referred to as the read voltage (Vdsr)) is applied to the source region 16, and the drain region 18 is at the ground potential. A read current thereby flows from the source region 16 to the drain region 18. The magnitude of the read current varies according to the amount of charge retained in the second charge accumulation section 32. Specifically, the read current is lower the larger the amount of current is that is retained in the second charge accumulation section 32. Consequently, the data stored in the second charge accumulation section 32 can be determined by measuring the magnitude of the read current.

Then, when erasing the data stored in the second charge accumulation section 32, a positive voltage (Vde) is applied to the drain region 18, a negative voltage (−Vge) is applied to the gate electrode 24, and a positive voltage (Vse) is applied to the source region 16. Hot holes generated at the periphery of the drain region 18 are thereby injected to the second charge accumulation section 32. As a result, the charge (electrons) retained in the second charge accumulation section 32 can be neutralized, and the data is erased.

Data can be written, read, or erased with respect to the first charge accumulation section 30 on the source side by substituting the voltages to be applied to the drain side for the voltages to be applied to the source side.

Figure 4:
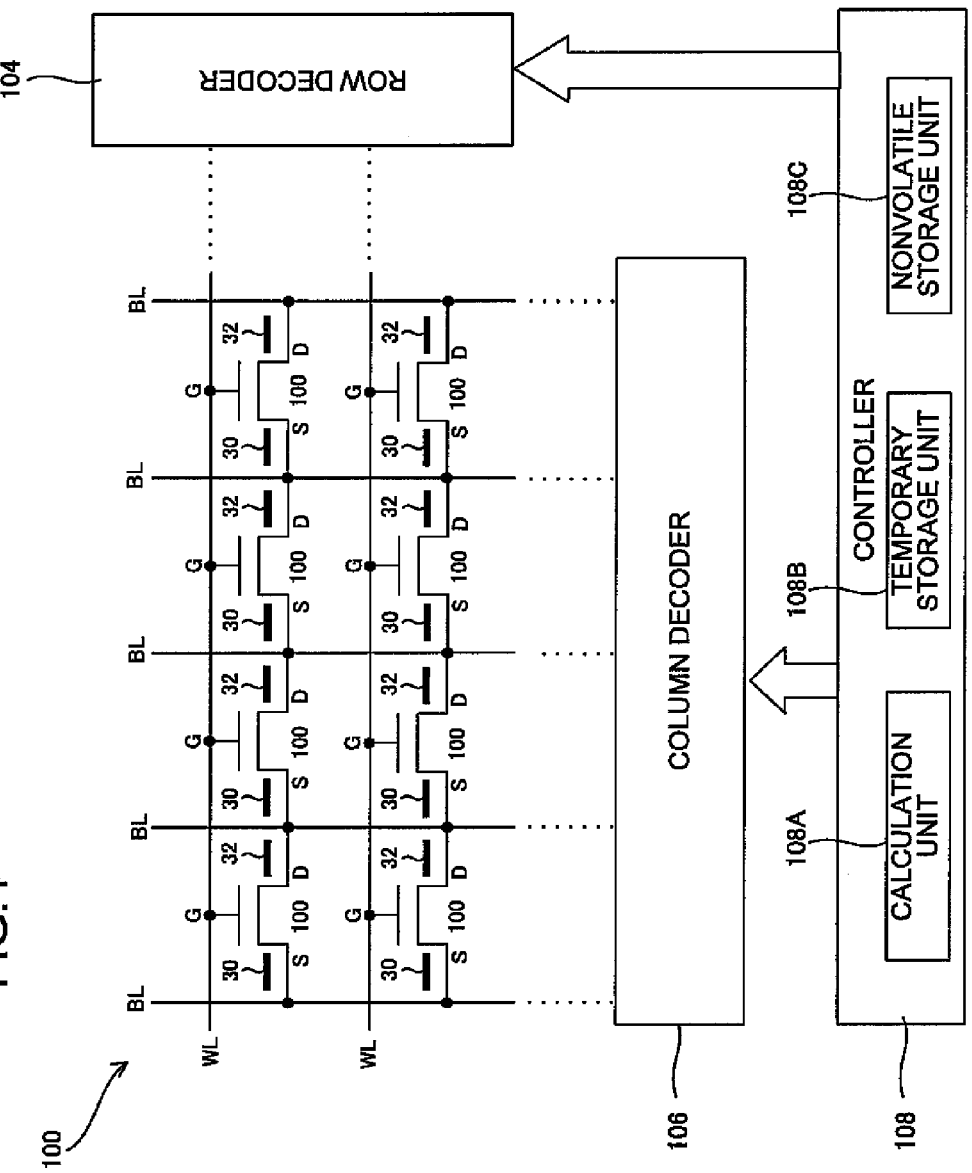
FIG. 4 is a view showing the overall structure of a nonvolatile semiconductor memory according to an embodiment of the present invention.

FIG. 4 shows the overall structure of the nonvolatile semiconductor memory 100 of the present embodiment. The nonvolatile semiconductor memory 100 is provided with a plurality of bit lines BL arranged in the column direction, and a plurality of word lines WL arranged in the row direction so as to intersect the bit lines BL. Memory cells 10 are provided at the intersections of the bit lines BL and the word lines WL, and a memory cell array is formed by the memory cells. The gate terminals of the memory cells 10 are connected to the word lines WL, and the source terminals and drain terminals are each connected to the bit lines BL. The drain-side bit lines BL and the source-side bit lines BL form pairs, and a write voltage is fed across the pairs of bit lines, whereby the write voltage is applied across the drain-source of each memory cell 10.

The word lines WL are each connected to a row decoder 104, and the bit lines BL are each connected to a column decoder 106. The row decoder 104 and the column decoder 106 are connected to a controller 108.

The controller 108 is provided with a calculation unit 108A for controlling the writing, reading, and erasing of data with respect to the memory cells; a temporary storage unit 108B for temporarily storing the stored data; and a nonvolatile storage unit 108C in which a data writing program or the like described hereinafter is stored. When data to be stored in the nonvolatile semiconductor memory 100 is inputted from the outside, the controller 108 executes a data writing program and feeds to the row decoder 104 a control signal that includes address information of the storage location and information that relates to the voltage to be applied to the word line WL. A control signal is fed to the column decoder that includes address information of the storage location and information relating to the voltage to be applied to the bit line BL in accordance with the stored data.

The row decoder 104 selects a word line WL on the basis of the control signal fed from the controller 108, and feeds the gate voltage (tgw) to the single selected word line WL. In the data write processing performed by the nonvolatile semiconductor memory 100 of the present embodiment, the same gate voltage (Vgw) is fed to the gate terminal of each memory cell regardless of the value of the stored data.

The column decoder 106 selects at least one pair of bit lines BL on the basis of the control signal fed from the controller 108, and feeds a write voltage (Vdsw) across the drain and source terminals of the memory cell connected to the selected bit lines BL. A write voltage (Vdsw) having a different voltage level for each of the four values of data to be stored is fed across the drain-source terminals of each memory cell. Specifically, the amount of charge injected to each memory cell is controlled by the drain-source voltage (Vdsw) fed via the bit lines BL. In the data write processing performed by the nonvolatile semiconductor memory 100 of the present embodiment, write voltages (Vdsw) having mutually different voltage levels are applied across the drain-source via the bit lines BL for a plurality of memory cells connected to the same word line WL, and data having mutually different values can thereby be written at the same time.

Figure 5:
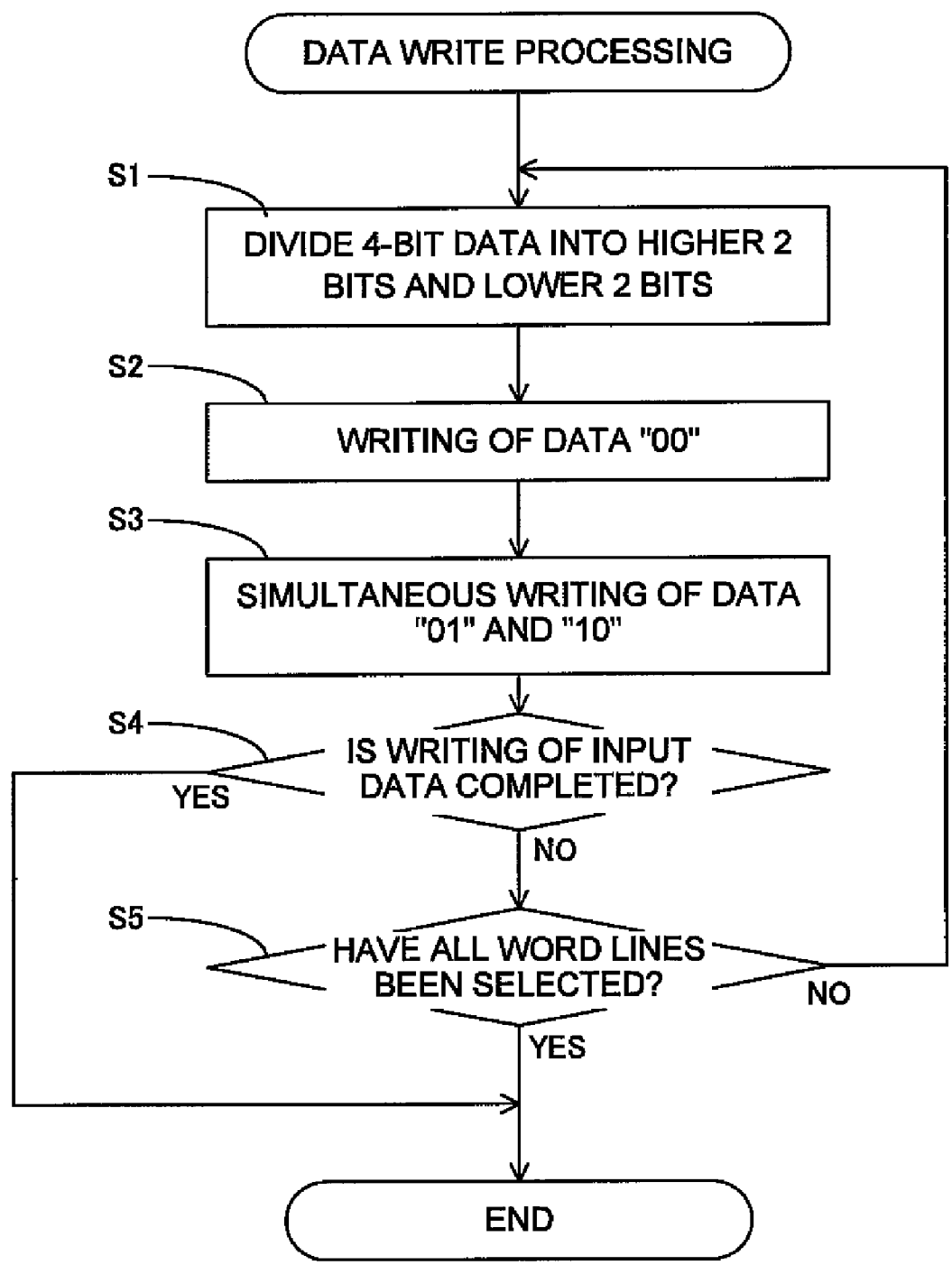
FIG. 5 is a flowchart showing the sequence of data write operations performed by the nonvolatile semiconductor memory according to an embodiment of the present invention.
Figure 6A:
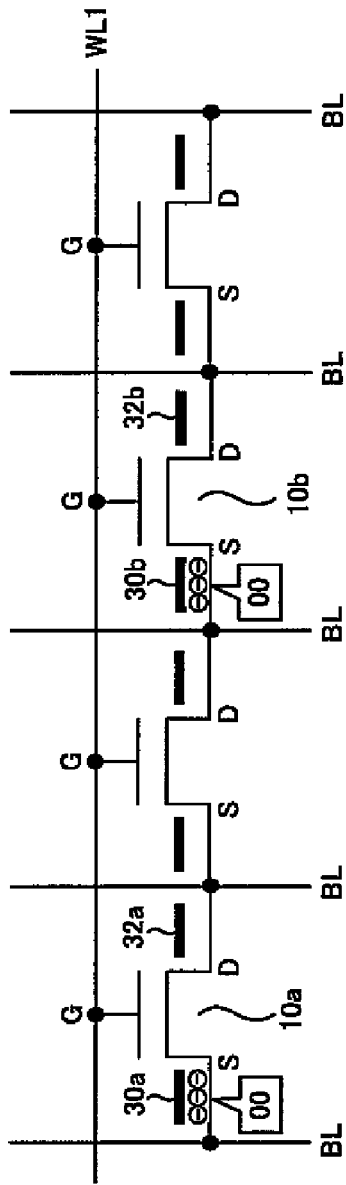
FIGS. 6A and 6B are views showing the data writing method for a nonvolatile semiconductor memory according to an embodiment of the present invention.
Figure 6B:
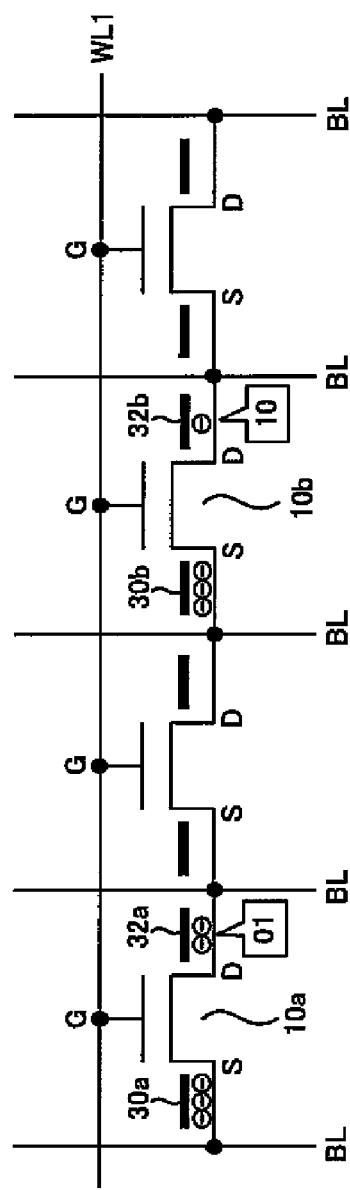

The data write operation performed by the nonvolatile semiconductor memory 100 of the present embodiment will next be described with reference to FIGS. 5, 6A, and 6B. FIG. 5 is a flowchart showing the flow of data write processing by the nonvolatile semiconductor memory 100 of the present embodiment. FIGS. 6A and 6B are views showing the steps performed during data writing to two memory cells 10a and 10b that are connected to the same word line, and shows a portion of the structure of the memory array that constitutes the nonvolatile semiconductor memory.

The data write processing of the present embodiment is performed for each word line WL, and the memory cells connected to the single selected word line WL are the memory cells to which data are written. When write processing is completed for all the memory cells connected to the single selected word line WL, another word line WL is selected. The memory cells connected to the newly selected word line WL are then targeted for writing. This sequential selection of word lines and write processing are repeated until storage of the data to be stored is completed, or until writing is completed for all of the memory cells in the memory cell array. The specific data writing method is described in detail below.

When data to be stored in the nonvolatile semiconductor memory 100 is inputted from the outside, the controller 108 executes a data writing program that is stored in the nonvolatile storage unit 108C. The components constituting the nonvolatile semiconductor memory 100 operate in accordance with this data writing program.

The first step S1 of the data write processing is an input data division routine performed in order to correlate the storage data sequentially inputted from the outside with writing to the nonvolatile semiconductor memory 100 of the present embodiment. The calculation unit 108A of the controller 108 stores a portion of the sequentially fed input data (e.g., an amount of data that corresponds to the storage capacity of the memory cells connected to a single word line WL) in the temporary storage unit 108B. The calculation unit 108A sequentially retrieves the input data from the temporary storage unit 108B, divides the input data into data fragments for every two bits, attaches address information indicating a storage location in the memory cell array to each data fragment, and stores the data in the temporary storage unit 108B (step S1).

The second step S2 of the data write processing is a routine for writing the data "00" first. In the present embodiment, a case is described in which the data "00" is written to the source-side first charge accumulation sections 30a and 30b of the memory cells 10a and 10b connected to the word line WL1 shown in FIGS. 6A and 6B. The controller 108 extracts from the temporary storage unit 108B only the data "00" for which the magnitude of the read current is least among the divided 2-bit data fragments, and feeds a control signal to the row decoder 104 and the column decoder 106 in order for processing to take place for writing the data to the memory cells indicated by the address information attached to the data.

The row decoder 104 applies a predetermined gate voltage (Vgw) for a predetermined write time to the word line WL1 that corresponds to the memory cells that are the targets for data writing as indicated by the address information included in the control signal fed from the controller 108. Specifically, the row decoder 104 applies a gate voltage (Vgw) to the gate terminals of the memory cells 10a and 10b via the word line WL1 on the basis of the control signal.

The column decoder 106 applies a predetermined write voltage (Vdsw) that corresponds to the stored data "00" across the bit lines BL that correspond to the memory cells that are targets for data writing as indicated by the address information included in the control signal fed from the controller 108. Specifically, the column decoder 106 applies a write voltage (Vdsw) that is in accordance with the data "00" to the bit lines BL connected to the respective source terminals of the memory cells 10a and 10b on the basis of the control signal, and sets the bit lines BL connected to the respective drain terminals of these memory cells to the ground potential. A write voltage (Vdsw) in accordance with the data "00" is thereby applied across the drain-source terminals of the memory cells 10a and 10b, and a certain amount of charge is injected to the first charge accumulation sections 30a and 30b.

When the first charge injection is completed for the memory cells, the controller 108 feeds a control signal to the row decoder 104 and the column decoder 106 in order to verify the read currents of the memory cells 10a and 10b targeted for writing, to which a charge was injected.

The row decoder 104 applies a predetermined gate voltage (Vgr) for data reading to the word line WL1 that corresponds to the memory cells 10a and 10b targeted for data reading as indicated by the address information included in the control signal fed from the controller 108.

The column decoder 106 applies a predetermined read voltage (Vdsr) to the bit lines BL that correspond to the memory cells 10a and 10b targeted for data reading as indicated by the address information included in the control signal fed from the controller 108. Specifically, a predetermined read voltage (Vdsr) is applied to the bit lines BL connected to the drain terminals of the memory cells 10a and 10b, and the bit lines BL connected to the source terminals are set to the ground potential. A read current thereby flows between the drain and source of the memory cells 10a and 10b.

The controller 108 measures the value of the read current obtained via the bit lines BL and determines whether the value of the read current reaches a predetermined value that corresponds to the data "00." When the controller 108 has determined that the value of the read current has not reached the predetermined value, the controller 108 feeds a control signal to the row decoder 104 and the column decoder 106 to perform a second charge injection, and when a second charge injection to the first charge accumulation sections 30a and 30b of the memory cells 10a and 10b in accordance with this control signal is completed, the controller 108 again measures the read current and makes the determination described above. Charge injection and verification of the read current are performed multiple times until the value of the read current reaches the predetermined value that corresponds to the data "00." When the controller 108 determines that the read current has reached the predetermined value, the processing for writing the data "00" is completed.

In the processing for writing data to the memory cells, by repeatedly alternating between charge injection and write current verification, an amount of charge that corresponds to the data "00" is injected to the charge accumulation section targeted for writing. Through this writing method, fluctuation of the read current between cells can be reduced, the precision of writing and reading can be enhanced, excessive charge injection can be prevented, and the current window can be ensured in comparison to a case in which an amount of charge that corresponds to the stored data is injected at once. FIG. 6A shows a state in which processing for writing the data "00" to the first charge accumulation sections 30a and 30b of the memory cells 10a and 10b has been completed.

The third step S3 of the data write processing is a routine for writing the data "01" and "10" at the same time. The controller 108 extracts the data "01" and "10" from the temporary storage unit 108B, and feeds a control signal to the row decoder 104 and the column decoder 106 in order for processing to take place for writing the data to the memory cells indicated by the address information attached to the data. Since the absence of a charge accumulated in a charge accumulation section corresponds to the data "11," there is no need for specific processing when the data "11" is written. In the present embodiment, an example is described in which the data "01" is written to the second charge accumulation section 32a on the drain side of the memory cell 10a connected to the word line WL1 in FIGS. 6A and 6B, and the data "10" is written to the second charge accumulation section 32b on the drain side of the memory cell 10b.

In this case, the row decoder 104 applies a predetermined gate voltage (Vgw) for a predetermined write time to the word line WL1 on the basis of the control signal. The column decoder 106 applies a predetermined write voltage (Vdsw) that corresponds to the data "01" to the bit line BL connected to the drain terminal of the memory cell 10a, on the basis of the control signal, and sets the bit line BL connected to the source terminal to the ground potential. The row decoder 104 concurrently applies a predetermined write voltage (Vdsw) that corresponds to the data "10" to the bit line BL connected to the drain terminal of the memory cell 10b, and sets the bit line BL connected to the source terminal to the ground potential. Write voltages (Vdsw) corresponding to the data "01" and "00" are thereby simultaneously applied across the drain-source terminals of the memory cells 10a and 10b, and a certain amount of charge is injected to the second charge accumulation sections 32a and 32b.

When the first charge injection is completed for the memory cells, the controller 108 feeds a control signal to the row decoder 104 and the column decoder 106 in order to verify the read currents of the memory cells 10a and 10b targeted for writing, to which a charge was injected.

The row decoder 104 applies a predetermined gate voltage (Vgr) for data reading to the word line WL1 that corresponds to the memory cells 10a and 10b targeted for data reading as indicated by the address information included in the control signal fed from the controller 108.

The column decoder 106 applies a predetermined read voltage (Vdsr) to the bit lines BL that correspond to the memory cells 10a and 10b targeted for data reading as indicated by the address information included in the control signal fed from the controller 108. Specifically, a predetermined read voltage (Vdsr) is applied to the bit lines BL connected to the source terminals of the memory cells 10a and 10b, and the bit lines BL connected to the drain terminals are set to the ground potential. A read current thereby flows between the drain and source of the memory cells 10a and 10b.

The controller 108 measures the value of the read currents obtained via the bit lines BL and determines whether the values of the read currents have reached predetermined values that correspond to the data "01" and "10." When the controller 108 has determined that the values of the read currents have not reached the predetermined values, the controller 108 feeds a control signal to the row decoder 104 and the column decoder 106 to perform a second charge injection, and when a second charge injection to the second charge accumulation sections 32a and 32b of the memory cells 10a and 10b in accordance with this control signal is completed, the controller 108 again measures the read currents and makes the determination described above. Charge injection and verification of the read currents are performed a plurality of times until the values of the read currents reach the predetermined values that correspond to the data "01" and "10." When the controller 108 determines that the read currents have reached the predetermined values, the processing for writing the data "01" and "10" is completed.

In the processing for writing the data "01" and "10" to the memory cells, by repeatedly alternating between charge injection and write current verification in the same manner as when writing the data "00," amounts of charge that correspond to the data "01" and "10" are injected to the charge accumulation sections targeted for writing. Through this writing method, fluctuation of the read current between cells can be reduced, the precision of writing and reading can be enhanced, excessive charge injection can be prevented, and the current window can be ensured in comparison to a case in which an amount of charge that corresponds to the stored data is injected at once.

In the present embodiment, four values of data are stored by varying the write voltage (Vdsw) applied to the bit lines BL connected to the drain terminals and source terminals of the memory cells according to the stored data. Write processing can therefore be performed simultaneously for a plurality of memory cells connected to the same word line WL. Data write processing is thus completed for all the memory cells connected to the word line WL1. FIG. 6B shows a state in which processing for writing the data "01" to the second charge accumulation section 32a of the memory cell 10a, and processing for writing the data "10" to the second charge accumulation section 32b of the memory cell 10b have been completed.

The fourth step S4 of the data write processing is a routine for determining whether write processing for all the input data has been completed. When the controller 108 determines that write processing for all the input data to be stored in the nonvolatile semiconductor memory 100 is not yet completed, the process proceeds to step S5. When the controller 108 determines that write processing for all the input data has been completed, the data write processing is ended.

The fifth step S5 of the data write processing is a routine for determining whether all the word lines in the memory cell array have been selected. In other words, in this step, a determination is made as to whether write processing has already been completed for all the memory cells in the memory cell array. When the controller 108 determines that a yet-unselected word line WL is present, the process returns to step S1, and data write processing is continued. In this case, another word line is selected, the memory cells connected to this word line are targeted for writing, and steps S1 through S3 of data write processing are performed. In step S5, when the controller 108 determines that all of the word lines WL have been selected, the data write processing is ended.

Figure 7A:
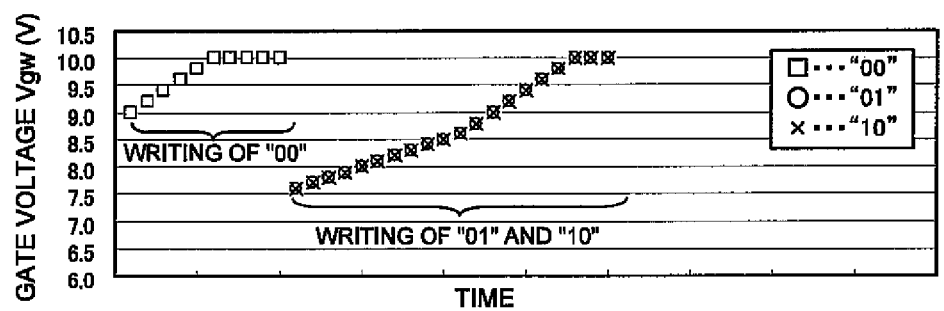
FIGS. 7A and 7B are graphs showing the transition over time of various voltages applied to the memory cells in data write processing according to an embodiment of the present invention.
Figure 7B:
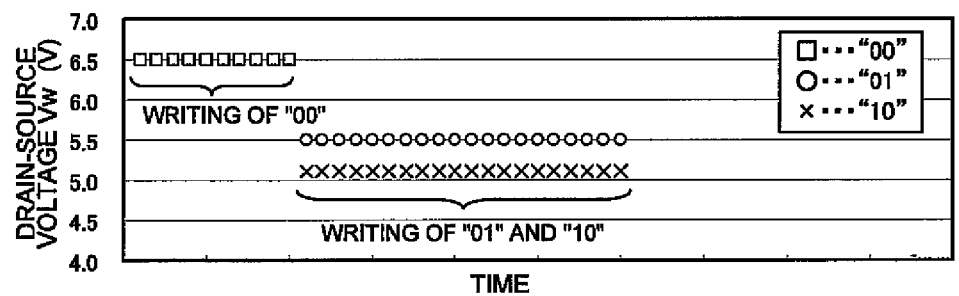

FIGS. 7A and 7B show an example of the transition over time of the various voltages applied to the memory cells in the data write processing of the second and third steps described above. FIG. 7A shows the transition over time of the gate voltage (Vgw) applied to the gate terminal of each memory cell via the word line WL1. FIG. 7B shows the transition over time of the write voltage (Vdsw) applied across the drain-source terminals of the memory cells via the bit lines BL. The plotted points in the graphs indicate the voltage values over the course of the plurality of charge injections that takes place during data writing, wherein the square plots indicate voltages applied during writing of the data "00," the circular plots indicate voltages applied during writing of the data "01," and the X-shaped plots indicate voltages applied during writing of the data "10."

It is apparent from FIGS. 7A and 7B as well that the data "00" having the lowest read current is written first. Writing of the data "00" is completed by a course of ten charge injections, as shown in the graphs. At this time, a gate voltage Vgw of 9 V to 10 V is applied to the word line WL1 in incrementally increasing fashion with each charge injection. A constant write voltage (Vdsw) of 6.5 V that corresponds to the data "00" is applied via the bit lines BL across the source-drain terminals of the memory cells 10a and 10b.

It is also apparent that processing for writing the data "01" and "10" is simultaneously performed after the data "00" has been written. Writing of the data "01" and "10" is completed by a course of twenty charge injections, as shown in the graphs. At this time, a gate voltage Vgw of 7.5 V to 10 V is applied to the word line WL1 in incrementally increasing fashion with each charge injection. A constant write voltage (Vdsw) of 5.5 V that corresponds to the data "01" is applied via the bit lines BL across the source-drain terminals of the memory cell 10a, and a constant write voltage (Vdsw) of 5.1 V that corresponds to the data "10" is applied via the bit lines BL across the source-drain terminals of the memory cell 10b.

In the data writing method for a nonvolatile semiconductor memory of the present invention, amounts of charge that correspond to each data element are injected by making the gate voltage (Vgw) applied to the gate terminals of the memory cells via the word line WL common among the data values, and making the write voltage (Vdsw) applied across the drain-source terminals of the memory cells via the bit lines BL different for each value of stored data. In a scheme in which word lines WL are sequentially selected for data writing, such as in the present embodiment, processing for writing four values of data is performed by this method, whereby the bit lines BL are provided independently to the memory cells connected to a single selected word line WL, different values of data can be simultaneously written to a plurality of memory cells in the time that a single word line WL is selected, and the write time can be shortened in comparison to the conventional technique.

In the present embodiment, the gate voltage Vgw is applied in incrementally increasing fashion over the course of a plurality of charge injections, and the reason for adopting this configuration is described below. Specifically, when the applied gate voltage Vgw is kept constant over the course of a plurality of charge injections, the electric field applied to the tunnel oxide film during writing decays as charges are accumulated in the charge accumulation section, and the amount of electrons injected to the charge accumulation section decreases each time the number of injections increases, and as a result, the amount of variation of the read current becomes saturated. By incrementally increasing the applied gate voltage Vgw each time the number of charge injections increases, as in the present embodiment, the electric field applied to the tunnel oxide film is made constant during writing. Charges can therefore be efficiently injected, and the write time can be reduced.

When the data "01" and "10" are written to two charge accumulation sections 30a and 30b of a single memory cell 10a, for example, a plurality of cycles of charge injection processing and read current verification processing is performed in alternating fashion for the two charge accumulation sections. The write voltage (Vdsw) applied to the memory cell during charge injection is also set to an appropriate value so that there is an equal number of charge injections for each of the two charge injection sections in the memory cell. For example, the write voltage Vdsw for writing the data "01" is set to 5.5 V, and the write voltage Vdsw for writing the data "10" is set to 5.1 V in the present embodiment so that the processing for writing the data "01" and "10" is completed by a course of twenty charge injections. The number of charge injections is thus coordinated when writing data to each of the two charge accumulation sections of one memory cell, and write processing alternates between the two charge accumulation sections. Each side can thereby prevent the read current from fluctuating in the other side.

Figure 2A:
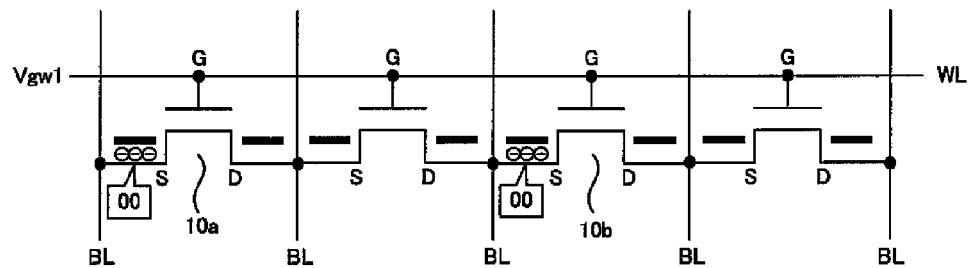
FIGS. 2A through 2C are views showing the conventional data writing method for a nonvolatile semiconductor memory.
Figure 2B:
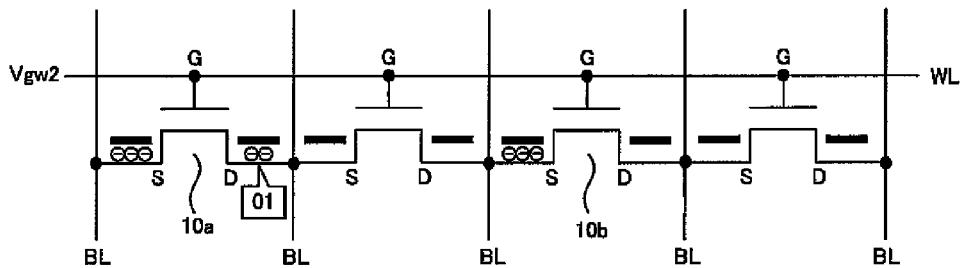
Figure 2C:
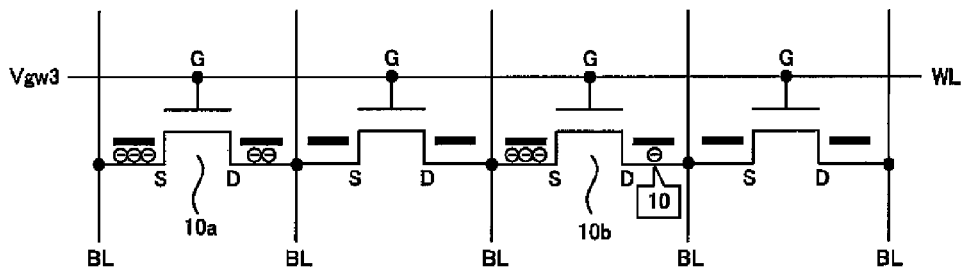
Figure 8A:
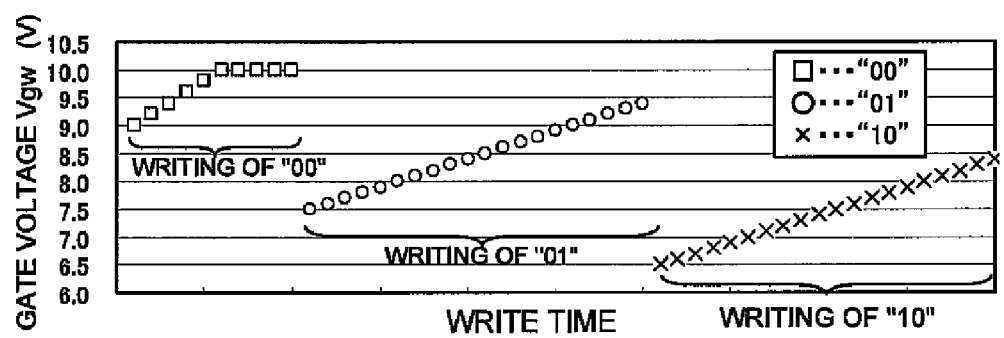
FIGS. 8A and 8B are graphs showing the transition over time of various voltages applied to the memory cells in the conventional data write processing.
Figure 8B:
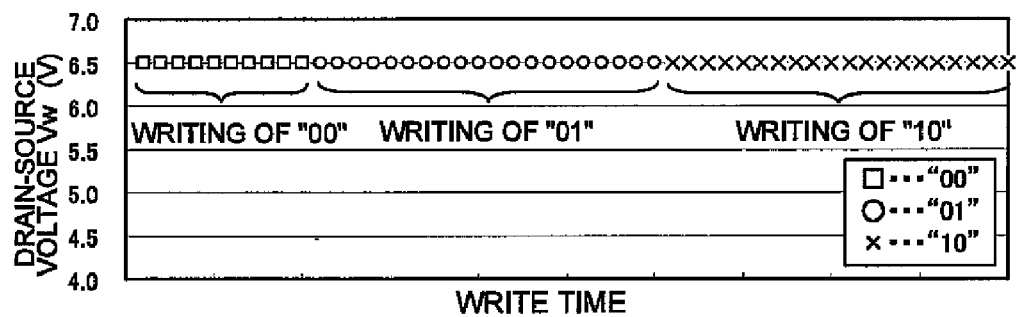

FIGS. 8A and 8B show the transition over time of the various voltages applied to the memory cells in a case in which the same data as described above are written to the memory cells 10a and 10b by the conventional method, whereby four values of data are written by varying the gate voltage (Vgw) applied to the memory cells according to the stored data. FIGS. 8A and 8B are comparable to FIGS. 7A and 7B showing an embodiment of the present invention. Specifically, FIGS. 8A and 8B show the procedure whereby voltages are applied to obtain the state of writing shown in FIGS. 2A through 2C. FIG. 8A shows the transition over time of the gate voltage (Vgw) applied to the gate terminals of the memory cells, and FIG. 8B shows the transition over time of the write voltage (Vdsw) applied across the drain-source terminals of the memory cells. The relationship between the types of plotted points and the stored data is the same as in FIGS. 7A and 7B.

It is apparent from FIGS. 8A and 8B that the data "00" having the lowest read current is written first. Writing of the data "00" is completed by a course of ten charge injections. At this time, a gate voltage Vgw of 9 V to 10 V is applied to the word line WL1 in incrementally increasing fashion with each charge injection. A constant write voltage (Vdsw) of 6.5 V is applied via the bit lines BL across the source-drain terminals of the memory cells 10a and 10b.

The data "01" is written after writing of the data "00" is completed. Writing of the data "01" is completed by a course of twenty charge injections. At this time, a gate voltage Vgw of 7.5 V to 9.4 V corresponding to the data "01" is applied to the word line WL1 in incrementally increasing fashion with each charge injection. A constant write voltage (Vdsw) of 6.5 V is applied via the bit lines BL across the source-drain terminals of the memory cell 10a.

The data "10" is written after writing of the data "01" is completed. Writing of the data "10" is completed by a course of twenty charge injections. At this time, a gate voltage Vgw of 6.5 V to 8.4 V corresponding to the data "10" is applied to the word line WL1 in incrementally increasing fashion with each charge injection. A constant drain-source voltage (Vw) of 6.5 V is applied via the bit lines BL across the source-drain terminals of the memory cell 10a to which the data "10" is to be written.

In the conventional method for writing four values of data by varying the applied gate voltage Vgw according to the stored data, since the gate voltage Vgw applied to the word line WL must be varied according to the stored data when different values of data are stored, it is impossible to write different values of data at the same time to a plurality of memory cells in the time that a single word line WL is selected, and this inability results in increased write time.

However, according to the data writing method for a nonvolatile semiconductor memory of the present invention, when four values of data are written, the same gate voltage Vgw is applied to the gate terminals of the memory cells for each value of data, the write voltage (Vdsw) applied across the drain-source terminals of the memory cells is varied according to the value of the stored data, and data having different values can be written at the same time to a plurality of memory cells in the time that a single word line WL is selected. The write time can therefore be reduced in comparison with the conventional writing method.

Since the data "00" having the lowest read current is written first, after which the other data "01" and "10" are written, and charges are injected incrementally over the course of a plurality of cycles during the writing of each data element, fluctuation of the read current between cells can be suppressed, and the current window can be ensured. Specifically, since the data "00" having the lowest read current is written first, it is possible to prevent the read currents of the data "01" and "10" written to the other charge accumulation section of the same memory cell from subsequently fluctuating. Although the read current of the data "00" is reduced by the data "01" and "10" subsequently written to the charge accumulation section on the opposite side of the same memory cell, since the data "00" has the lowest read current of the four values of data, the current window is not narrowed, and no problems therefore occur. For the data "01" and "10" subsequently written, since charges are injected incrementally over a plurality of cycles while the read current is verified, fluctuation of the read current between cells can be minimized, and an adequate current window can be ensured.

Second Embodiment

Figure 9:
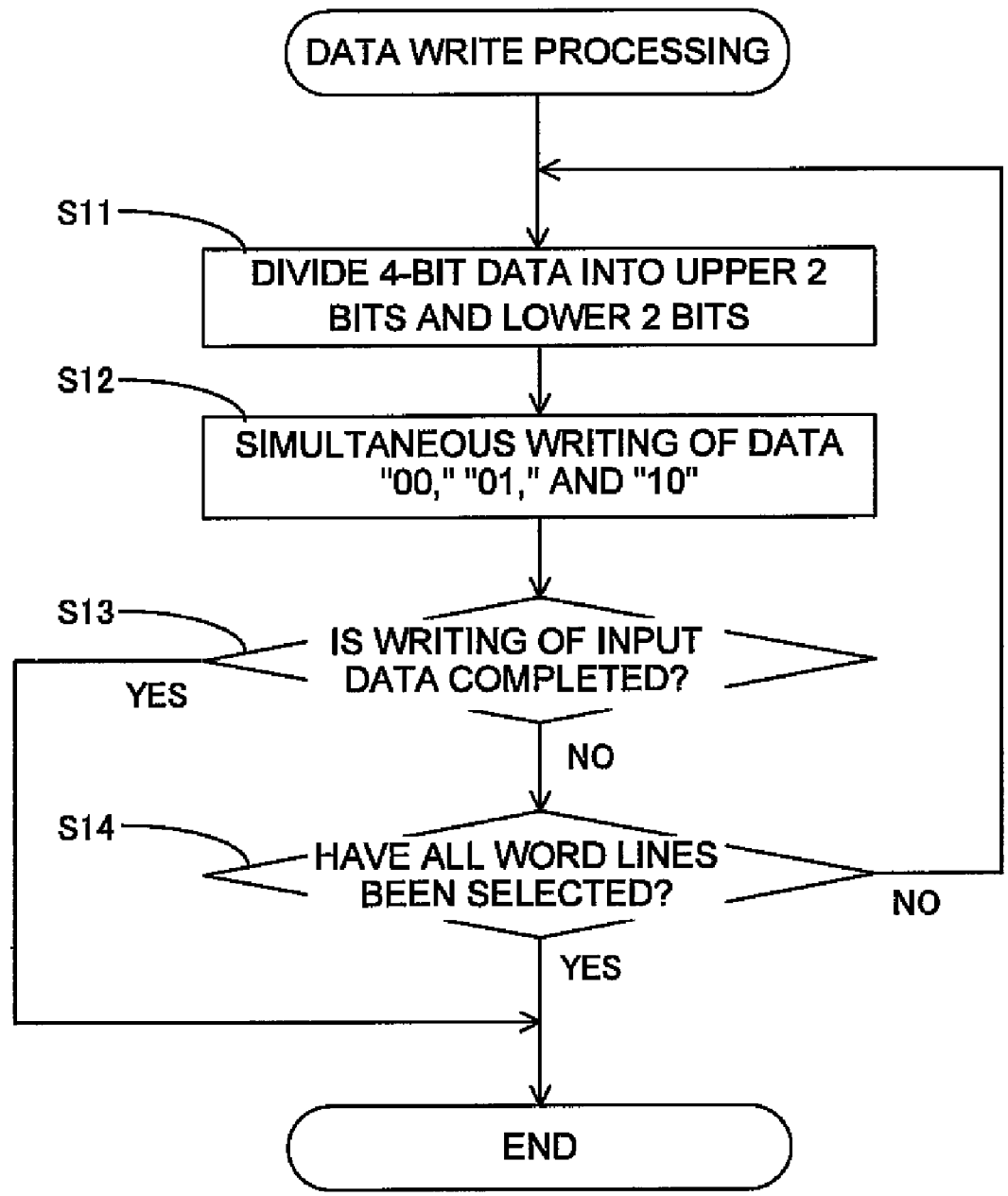
FIG. 9 is a flowchart showing the sequence of data write operations performed by the nonvolatile semiconductor memory according to another embodiment of the present invention.
Figure 10:
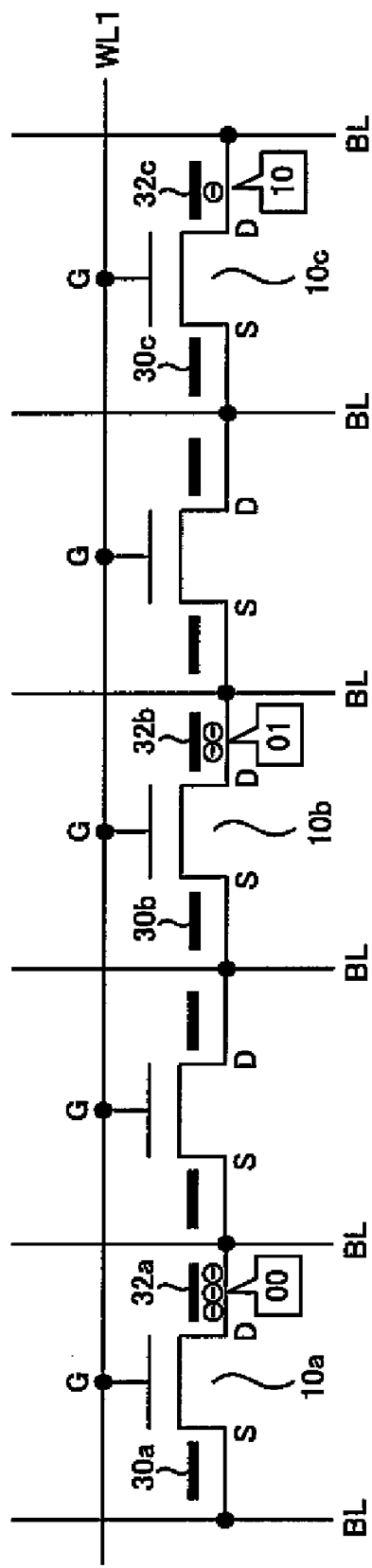
FIG. 10 is a view showing the data writing method for a nonvolatile semiconductor memory according to another embodiment of the present invention.

The data writing method according to a second embodiment of the present invention is described below. FIG. 9 is a flowchart showing the flow of data write processing by the nonvolatile semiconductor memory 100 of the present embodiment. FIG. 10 is a view showing the steps performed during data writing to three memory cells 10a, 10b, and 10c that are connected to the same word line, and shows a portion of the structure of the memory array that constitutes the nonvolatile semiconductor memory.

The data write processing of the present embodiment is performed for each word line WL in the same manner as in the first embodiment, and the memory cells connected to the single selected word line WL are the memory cells to which data are written. When write processing is completed for all the memory cells connected to the single selected word line WL, another word line WL is selected. The memory cells connected to the newly selected word line WL are then targeted for writing. This sequential selection of word lines and write processing are repeated until storage of the data to be stored is completed, or until writing is completed for all of the memory cells in the memory cell array. The specific data writing method is described in detail below.

When data to be stored in the nonvolatile semiconductor memory 100 is inputted from the outside, the controller 108 executes a data writing program that is stored in the nonvolatile storage unit. The components constituting the nonvolatile semiconductor memory 100 operate in accordance with this data writing program.

The first step S11 of the data write processing is an input data division routine performed in order to correlate the storage data sequentially inputted from the outside with writing to the nonvolatile semiconductor memory 100 of the present embodiment. The calculation unit 108A of the controller 108 stores a portion of the sequentially fed input data (e.g., an amount of data that corresponds to the storage capacity of the memory cells connected to a single word line WL) in the temporary storage unit 108B. The calculation unit 108A sequentially retrieves the input data from the temporary storage unit 108B, divides the input data into data fragments for every two bits, attaches address information indicating a storage location in the memory cell array to each divided data fragment, and stores the data in the temporary storage unit 108B (step S11).

The second step S12 of the data write processing is a routine for writing the data "00," "01," and "10" at the same time. In the present embodiment, a case is described in which the data "00" is written to the drain-side second charge accumulation section 32a of the memory cell 10a connected to the word line WL1 shown in FIG. 10, the data "01" is written to the drain-side second charge accumulation section 32b of the memory cell 10b, and the data "10" is written to a drain-side second charge accumulation section 32c of the memory cell 10c. Since a state in which a charge is not retained in a charge accumulation section corresponds to the data "11," there is no need for specific write processing when the data "11" is stored.

The controller 108 extracts the divided 2-bit data fragments "00," "01," and "10" from the temporary storage unit 108B, and feeds a control signal to the row decoder 104 and the column decoder 106 in order for processing to take place for writing the data to the memory cells indicated by the address information attached to the data.

The row decoder 104 applies a predetermined gate voltage (Vgw) for a predetermined write time to the word line WL1 that corresponds to the memory cells that are the targets for data writing as indicated by the address information included in the control signal fed from the controller 108. Specifically, the row decoder 104 applies a gate voltage (Vgw) to the gate terminals of the memory cells 10a, 10b, and 10c via the word line WL1 on the basis of the control signal.

The column decoder 106 applies a predetermined write voltage (Vdsw) that corresponds to the stored data "00" to the bit line BL that is connected to the drain terminal of the memory cell 10a on the basis of the control signal, and sets the bit line BL that is connected to the source terminal to the ground potential. The row decoder 104 concurrently applies a predetermined write voltage (Vdsw) corresponding to the data "10" to the bit line BL that is connected to the drain terminal of the memory cell 10b, and sets the bit line BL that is connected to the source terminal to the ground potential. The row decoder 104 also concurrently applies a predetermined write voltage (Vdsw) corresponding to the data "10" to the bit line BL that is connected to the drain terminal of the memory cell 10c, and sets the bit line BL that is connected to the source terminal to the ground potential. Write voltages (Vdsw) that are in accordance with the data "00," "01," and "10" are thereby simultaneously applied across the drain-source terminals of the memory cells 10a, 10b, and 10c, and a certain amount of charge is injected to the second charge accumulation sections 32a, 32b, and 32c.

When the first charge injection is completed for the memory cells, the controller 108 feeds a control signal to the row decoder 104 and the column decoder 106 in order to verify the read currents of the memory cells 10a, 10b, and 10c targeted for writing, to which a charge was injected.

FIG. 10 shows a case in which the data "00" is written to the second charge accumulation section 32a of the memory cell 10a, the data "01" is written to the second charge accumulation section 32b of the memory cell 10b, and the data "10" is written to the second charge accumulation section 32c of the memory cell 10c by this processing for writing all the data values at the same time.

Figure 11A:
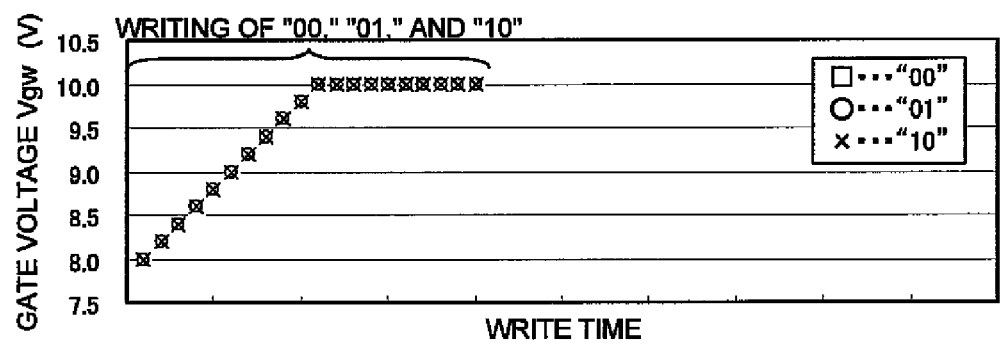
FIGS. 11A and 11B are graphs showing the transition over time of various voltages applied to the memory cells in data write processing according to another embodiment of the present invention.
Figure 11B:
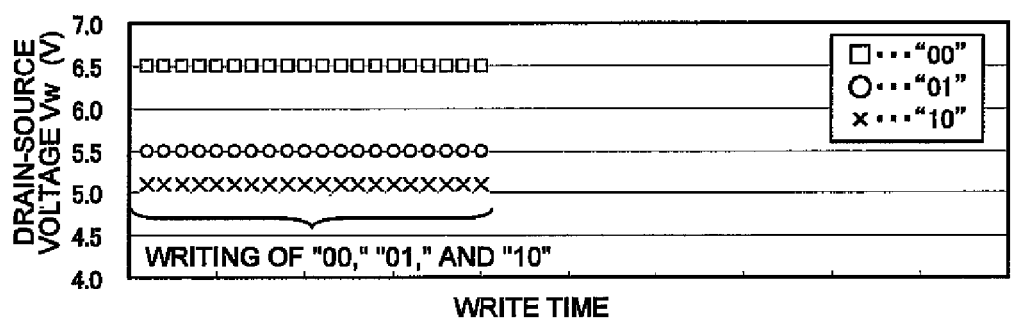

FIGS. 11A and 11B show an example of the transition over time of the various voltages applied to the memory cells in the processing of the second step S12 described above, in which all the data values are written at the same time. FIG. 11A shows the transition over time of the gate voltage (Vgw) applied to the gate terminals of the memory cells via the word line WL1. FIG. 11B shows the transition over time of the write voltage (Vdsw) applied across the drain-source terminals of the memory cells via the bit lines BL. The plotted points in the graphs indicate the voltage values over the course of the plurality of charge injections that takes place during data writing, wherein the square plots indicate voltages applied during writing of the data "00," the circular plots indicate voltages applied during writing of the data "01," and the X-shaped plots indicate voltages applied during writing of the data "10."

It is apparent from FIGS. 11A and 11B as well that the data "00," "01," and "10" are written at the same time. Writing of each value of data is completed by a course of twenty charge injections, as shown in the graphs. At this time, a gate voltage Vgw of 8 V to 10 V is applied to the word line WL1 in incrementally increasing fashion with each charge injection. A constant write voltage (Vdsw) of 6.5 V that corresponds to the data "00" is applied via the bit lines BL across the source-drain terminals of the memory cell 10a, while at the same time, a constant write voltage (Vdsw) of 5.5 V that corresponds to the data "01" is applied via the bit lines BL across the source-drain terminals of the memory cell 10b, and a constant write voltage (Vdsw) of 5.1 V that corresponds to the data "10" is applied via the bit lines BL across the source-drain terminals of the memory cell 10c.

According to the writing method of the present embodiment, all of the data ("00," "01," "10") that require specific write processing are written at the same time to a plurality of memory cells connected to the same word line WL, and the write time can therefore be further reduced. In other words, the present embodiment does away with the step of the data writing method of the first embodiment, in which the data "00" is written first. It is thereby possible for write processing to be performed concurrently for all of the memory cells that are connected to the same word line WL, and data can therefore be written more efficiently.

Examples were described in the above embodiments in which the present invention was applied to a nonvolatile semiconductor memory having two charge accumulation sections in one memory cell, but the present invention may also be applied when a single memory cell has one charge accumulation section, or three or more charge accumulation sections. The present invention can also be applied in a case in which data having four or more values (2-bit or higher data) is stored in each charge accumulation section.

The present invention was described above by way of preferred embodiments. Various modifications or changes may be apparent to one skilled in the art, and all of such modifications or changes are considered to be encompassed by the attached claims.

This application is based on the Japanese Patent Application No. 2008-188791, the entire content of which is incorporated by reference herein.

What is claimed is:

1. A method for writing data to a nonvolatile semiconductor memory by injecting a charge to charge accumulation sections of memory cells of the nonvolatile semiconductor memory and writing multi-value data in which a data value corresponds to an amount of injected charge, the nonvolatile semiconductor memory having:
   a plurality of word lines;
   a plurality of memory cells, each of which having a plurality of charge accumulation sections, and having a MOSFET structure in which a gate terminal is connected to each of said word lines; and
   a plurality of bit lines connected to a drain terminal and a source terminal of each of said memory cells; the method comprising:
   applying the same gate voltage to each of the gate terminals of said plurality of memory cells via said word lines to designate the memory cells as a write target,
   simultaneously applying a write voltage that corresponds to each write data across drain-source terminals of two or more memory cells that are write targets via said bit lines to write simultaneously a plurality of data having mutually different data values to the memory cells.

2. The method for writing data to a nonvolatile semiconductor memory according to claim 1, wherein a data element for which the data value has the greatest amount of injected charge is written to any of the memory cells targeted for writing, whereupon a plurality of data elements having other data values is simultaneously written.

3. The method for writing data to a nonvolatile semiconductor memory according to claim 1, wherein charges are injected to said charge accumulation sections by a plurality of injection operations, and the gate voltage is set so that the voltage level thereof increases incrementally for each injection operation.

4. The method for writing data to a nonvolatile semiconductor memory according to claim 3, wherein after each operation for injection to said charge accumulation sections, a drain-source current value of said memory cell is detected, and charge injection is concluded when the drain-source current value reaches a predetermined value.

5. The method for writing data to a nonvolatile semiconductor memory according to claim 3, wherein the voltage level of the gate voltage is increased such that an electric field applied to an extension region is constant for each injection operation.

6. The method for writing data to a nonvolatile semiconductor memory according to claim 1, wherein the multi-value data is equal to or more than 2 bits in which a data value of the multi-value data corresponds to an amount of accumulated charge in the accumulation section of the memory cell.

7. A nonvolatile semiconductor memory comprising:
   a plurality of word lines;
   a plurality of memory cells, each of which having a charge accumulation section, and having a MOSFET structure in which a gate terminal is connected to each of said word lines;
   a plurality of bit lines connected to a drain terminal and a source terminal of each of said memory cells;
   a row decoder for applying a gate voltage to the gate terminals of said plurality of memory cells via said word lines; and
   a column decoder for applying a write voltage between the drain and source of each of said memory cells via said bit lines; wherein
   a charge is injected to said charge accumulation section, and multi-value data in which each data value corresponds to an injected charge amount is written to each of said memory cells;
   said row decoder applies the same gate voltage to each gate terminal of said memory cells via said word lines, and designates each of the memory cells as a write target; and
   said column decoder simultaneously applies, via said bit lines, write voltages that correspond to write data pieces across drain-source terminals of two or more memory cells that are write targets, and writes simultaneously a plurality of data having mutually different data values to each of the memory cells.

8. The nonvolatile semiconductor memory according to claim 7, wherein said column decoder feeds a write voltage corresponding to the data value to each memory cell to which data having the largest injected charge amount is to be written among the memory cells designated as write targets, and after writing of data to the corresponding memory cells is completed, said column decoder feeds the write voltages corresponding to the data values to each of the memory cells to which data having a plurality of other data values are to be written.

9. The nonvolatile semiconductor memory according to claim 7, wherein charges are injected to said charge accumulation sections by a plurality of injection operations, and the voltage level of the gate voltage is increased incrementally for each injection operation.

10. The nonvolatile semiconductor memory according to claim 9, wherein after each operation for injection to said charge accumulation sections, a drain-source current value of said memory cell is detected, and charge injection is ended when the drain-source current value reaches a predetermined value.

11. The nonvolatile semiconductor memory according to claim 9, wherein the voltage level of the gate voltage is increased such that an electric field applied to an extension region is constant for each injection operation.

12. The nonvolatile semiconductor memory according to claim 7, wherein the multi-value data is equal to or more than 2 bits in which a data value of the multi-value data corresponds to an amount of accumulated charge in the accumulation section of the memory cell.

* * * * *